US007902669B2

(12) United States Patent
Hwang

(10) Patent No.: US 7,902,669 B2
(45) Date of Patent: Mar. 8, 2011

(54) SEMICONDUCTOR DEVICE AND METHOD FOR MANUFACTURING THE SAME

(75) Inventor: Jong-Taek Hwang, Cheongju-si (KR)

(73) Assignee: Dongbu HiTek Co., Ltd., Seoul (KR)

( * ) Notice: Subject to any disclaimer, the term of this patent is extended or adjusted under 35 U.S.C. 154(b) by 229 days.

(21) Appl. No.: 12/255,052

(22) Filed: Oct. 21, 2008

(65) Prior Publication Data

US 2009/0108451 A1 Apr. 30, 2009

(30) Foreign Application Priority Data

Oct. 25, 2007 (KR) .................. 10-2007-0107651

(51) Int. Cl.
*H01L 23/52* (2006.01)
*H01L 23/48* (2006.01)
*H01L 29/40* (2006.01)

(52) U.S. Cl. ............ 257/751; 257/E21.247; 257/412; 257/755; 257/758; 438/643; 438/653; 438/927

(58) Field of Classification Search ......... 257/E23.158, 257/E23.164, E21.057, E21.135, E21.247, 257/412, 413, 369, 751, 755, 756, 758, 760; 438/199, 301, 303, 592, 627, 643, 653, 927

See application file for complete search history.

(56) References Cited

U.S. PATENT DOCUMENTS

| 5,382,533 | A | * | 1/1995 | Ahmad et al. | 438/301 |
| 5,641,983 | A | * | 6/1997 | Kato et al. | 257/412 |
| 5,998,271 | A | * | 12/1999 | Schwalke | 438/301 |
| 6,001,677 | A | * | 12/1999 | Shimizu | 438/231 |
| 6,114,765 | A | * | 9/2000 | Fujii et al. | 257/757 |
| 6,156,592 | A | * | 12/2000 | Kato et al. | 438/199 |
| 6,191,463 | B1 | * | 2/2001 | Mitani et al. | 257/411 |
| 6,710,407 | B2 | * | 3/2004 | Yamamoto | 257/344 |
| 7,205,186 | B2 | * | 4/2007 | Wang et al. | 438/197 |
| 7,297,603 | B2 | * | 11/2007 | Robb et al. | 438/289 |

FOREIGN PATENT DOCUMENTS

| KR | 10-2003-0001937 | 1/2003 |
| KR | 10-2005-0059740 | 6/2005 |
| KR | 10-2005-0105586 | 11/2005 |
| KR | 100760923 | 9/2007 |

* cited by examiner

*Primary Examiner* — Chris Chu
(74) *Attorney, Agent, or Firm* — Sherr & Vaughn, PLLC

(57) ABSTRACT

A semiconductor device includes a pattern layer formed on and/or over a semiconductor substrate, a fluorine-diffusion barrier layer containing a silicon-doped silicon oxide formed on and/or over the pattern layer, and an interlayer dielectric layer containing fluorine formed on and/or over the fluorine-diffusion barrier layer.

10 Claims, 2 Drawing Sheets

SEMICONDUCTOR DEVICE AND METHOD FOR MANUFACTURING THE SAME

Figure 1:
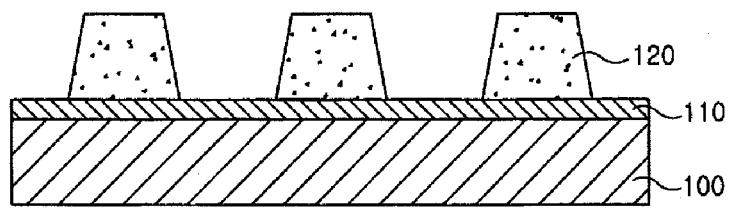

The present application claims priority under 35 U.S.C. §119 to Korean Patent Application No. 10-2007-0107651 (filed Oct. 25, 2007), which is hereby incorporated by reference in its entirety.

BACKGROUND

In general, when metal interconnections are formed in a semiconductor device, an insulating material, e.g., silicon oxide is used for electrical insulation between the metal interconnections serving as current paths. Since a fluorine-doped silicon oxide of such an insulating material has a lower dielectric constant (k) than an oxide that is not doped with fluorine, resulting in a decrease in a signal delay, it is used for an interlayer dielectric material of a semiconductor device requiring fine design rule. However, the doped fluorine atom has excellent diffusivity and thus, may produce a highly corrosive hydrofluoric acid (HF) through its chemical reaction with a hydroxyl group (OH) included in a tetra ethyl ortho silicate (TEOS)-based oxide of an underlying layer, e.g., a capping layer under a metal interconnection. Accordingly, hydrofluoric acid may cause air bubbles to be produced or metals to be corroded. When hydrofluoric acid is used to form predetermined patterns, such a phenomenon as previously described may also happen because a fluorine atom of the hydrofluoric acid reacts with a hydroxyl group included in a TEOS-based oxide.

SUMMARY

Embodiments relate to a semiconductor device and a method for manufacturing the semiconductor device that prevents fluorine atoms of an interlayer dielectric (ILD) layer from diffusing into a metal pattern and a layer thereunder.

Embodiments relate to a semiconductor device that may include at least one of the following: a metal pattern formed on and/or over a semiconductor substrate; a fluorine-diffusion barrier layer containing a silicon-doped silicon oxide formed on and/or over the metal pattern; and an ILD layer containing fluorine formed on and/or over the fluorine-diffusion barrier layer.

Embodiments relate to a method for manufacturing a semiconductor device that may include at least one of the following: forming a metal pattern on and/or over a semiconductor substrate; and then doping a silicon oxide with silicon to form a fluorine-diffusion barrier layer on and/or over the metal pattern; and then forming an ILD layer containing fluorine on and/or over the fluorine-diffusion barrier layer.

Embodiments relate to a method for manufacturing a semiconductor device that may include at least one of the following: forming a pattern layer formed over a semiconductor substrate; and then forming a fluorine-diffusion barrier layer containing a silicon-doped oxide material over the pattern layer; and then forming an interlayer dielectric layer containing fluorine over the fluorine-diffusion barrier layer.

Embodiments relate to a method for manufacturing a semiconductor device that may include at least one of the following: forming a pattern layer over a semiconductor substrate; and then forming silicon oxide layer over the pattern layer; and then forming a diffusion barrier layer including the silicon oxide layer by performing a first ion implantation process to dope silicon (Si) ions in the silicon oxide layer; and then performing an annealing process on the diffusion barrier layer; and then performing a second ion implantation process in order to dope nitrogen ions in the diffusion barrier layer using a gas mixture of $NH_3$ and $N_2$; and then forming a dielectric layer over the diffusion barrier layer after doping nitrogen ions in the diffusion barrier layer.

DRAWINGS

Example FIGS. 1 to 5 illustrate a semiconductor device and a method for manufacturing a semiconductor device in accordance with embodiments.

DESCRIPTION

As illustrated in example FIG. 1, a semiconductor device in accordance with embodiments may include insulating layer 110 formed on and/or over semiconductor substrate 100. Insulating layer 110 may be formed of silicon oxide ($SiO_2$). Metal pattern 120 is then formed on and/or over insulating layer 110. Metal pattern 120 may be formed of aluminum (Al), tungsten (W), or the like through a metallization process. Metal pattern may be formed of copper through a damascene process. Alternatively, a tetra ethyl ortho silicate (TEOS) pattern may be used instead of the metal pattern 120.

Figure 2:
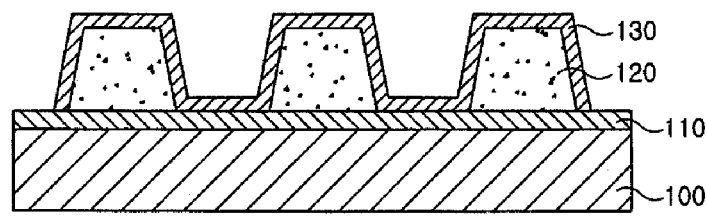
Figure 3:
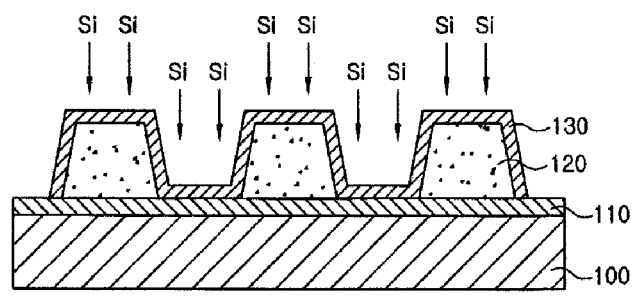
Figure 4:
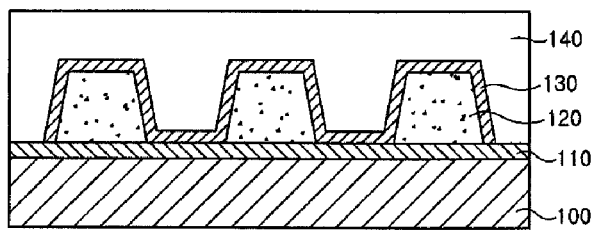

As illustrated in example FIGS. 2 to 4, after metal pattern 120 is formed, fluorine-diffusion barrier layer 130 containing a silicon-doped silicon oxide is formed on and/or over metal pattern 120. Fluorine-diffusion barrier layer 130 is formed by depositing a silicon oxide ($SiO_2$) layer having a thickness in a range between approximately 250 Å to 350 Å and then doping the silicon oxide with silicon (Si) through a first ion implantation process in order to form a hard crystalline texture. To recover a crystalline texture of fluorine-diffusion barrier layer 130 which may be damaged during the silicon-doping process, an annealing process is performed using a halogen lamp. Nitrogen ions are then doped in fluorine-diffusion barrier layer 130 through a plasma process using a gas mixture of $NH_3$ and $N_2$, resulting in a harder fluorine-diffusion barrier layer 130. As illustrated in example FIG. 4, interlayer dielectric (ILD) layer 140 formed of fluorinated silicon oxide (SiOF) is then deposited on and/or over fluorine-diffusion barrier layer 130 to cover fluorine-diffusion barrier layer 130 and metal pattern 120.

Figure 5:
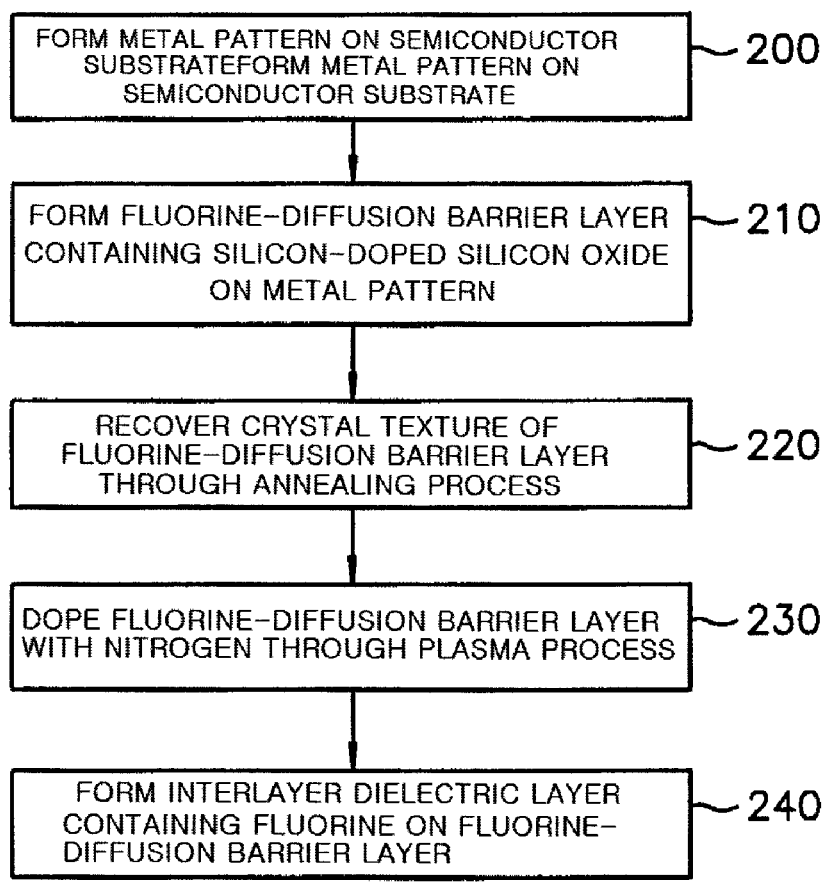

As illustrated in example FIG. 5, a method for manufacturing a semiconductor device in accordance with embodiments may include in operation 200, forming metal pattern 120 on and/or over semiconductor substrate 100. Thereafter, in operation 210, fluorine-diffusion barrier layer 130 containing a silicon-doped silicon oxide is formed on and/or over metal pattern 120. Particularly, silicon oxide is deposited having a thickness in a range between approximately 250 Å and 350 Å on and/or over metal pattern 120, and then silicon ions are implanted in the silicon oxide under conditions of a doping energy in a range between approximately 250 KeV to 750 KeV and a dosage in a range between approximately 5E13 atoms/$cm^2$ and 5E14 atoms/$cm^2$. As a result, the crystalline texture of the silicon oxide has a higher density than an un-doped silicon oxide. The silicon-doped silicon oxide should be recovered by performing n annealing process because the silicon-doping process may damage the crystal texture of the silicon oxide. Therefore, after operation 210, i.e., after the forming fluorine-diffusion barrier layer 130, an annealing process using a halogen lamp is followed to recover the damaged crystal texture of the silicon-doped silicon oxide in operation 220. The annealing temperature is in a range between approximately 300° C. and 400° C. and the annealing time is in a range between approximately 5 sec and 20 sec. Thus, reliability problems such as leakage current can be prevented.

To further harden fluorine-diffusion barrier layer 130, in operation 230, nitrogen ions are doped in the fluorine-diffusion barrier layer through a plasma process using a gas mixture of $NH_3$ and $N_2$ under conditions of a flow rate of $NH_3$ in a range between approximately 700 sccm and 2,000 sccm, a flow rate of $N_2$ in a range between approximately 2,500 sccm and 4,500 sccm, and a doping pressure in a range between approximately 3.5 torr and 4.5 torr. After fluorine-diffusion barrier layer 130 is formed, in operation 240, ILD layer 140 containing fluorinated SiOF is deposited and a deposition process of buried layers in a metal interconnection is finished.

In the semiconductor device in accordance with embodiments, by using fluorine-diffusion barrier layer 130, fluorine can be prevented from diffusing into metal pattern 120 and layers under the metal pattern even though fluorinated ILD layer 140 is buried in metal pattern 120. Also, the generation of the hydrofluoric acid through chemical reaction between the fluorine and the hydroxyl group of the TEOS-layer can be basically prevented.

Although embodiments have been described herein, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A semiconductor device comprising:
   a pattern layer formed over a semiconductor substrate;
   a fluorine-diffusion barrier layer containing a silicon-doped oxide material formed over the pattern layer; and
   an interlayer dielectric layer containing fluorine formed over the fluorine-diffusion barrier layer.

2. The semiconductor device of claim 1, wherein the fluorine-diffusion barrier layer has a thickness in a range between approximately 250 Å to 350 Å.

3. The semiconductor device of claim 1, further comprising an insulating layer composed of silicon oxide ($SiO_2$) formed between the semiconductor substrate and the pattern layer.

4. The semiconductor device of claim 1, wherein the pattern layer comprises a metal pattern layer.

5. The semiconductor device of claim 4, wherein the metal pattern layer comprises one of aluminum (Al), tungsten (W), and copper (Cu).

6. The semiconductor device of claim 1, wherein the pattern layer comprises an insulating pattern layer.

7. The semiconductor device of claim 6, wherein the insulating pattern layer comprises tetra ethyl ortho silicate (TEOS).

8. The semiconductor device of claim 1, wherein the silicon-doped oxide material comprises silicon oxide ($SiO_2$).

9. The semiconductor device of claim 1, wherein the silicon doped oxide material is also doped with nitrogen ions.

10. The semiconductor device of claim 1, wherein the interlayer dielectric (ILD) layer comprises fluorinated silicon oxide (SiOF).

* * * * *